(12) United States Patent
Cheng et al.

(10) Patent No.: US 11,177,191 B2
(45) Date of Patent: Nov. 16, 2021

(54) RIVET SPACER FOR COMPROMISING ASSEMBLING BETWEEN TWO PARTS SECURED TO EACH OTHER VIA SCREW STRUCTURE

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Shan-Yong Cheng, New Taipei (TW); Fang-Jwu Liao, New Taipei (TW); Ting-Yao Hung, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 213 days.

(21) Appl. No.: 16/426,381

(22) Filed: May 30, 2019

(65) Prior Publication Data
US 2020/0381333 A1 Dec. 3, 2020

(51) Int. Cl.
| | |
|---|---|
| H05K 1/18 | (2006.01) |
| H01L 23/40 | (2006.01) |
| H05K 7/12 | (2006.01) |

(52) U.S. Cl.
CPC .. *H01L 23/4006* (2013.01); *H01L 2023/4087* (2013.01); *H05K 1/18* (2013.01);
(Continued)

(58) Field of Classification Search
CPC . H01L 23/40; H05K 1/11; H05K 1/18; H01R 13/64; H01R 12/70; H01R 12/71; H01R 12/76
USPC ......... 361/756–759, 803, 807–810; 174/138; 439/65, 827, 908; 411/32–33, 44–45, 411/53–55, 144–145
See application file for complete search history.

(56) References Cited

U.S. PATENT DOCUMENTS 4,726,722 A * 2/1988 Wollar ................ F16B 19/1081
174/138 D
5,703,753 A * 12/1997 Mok .................... H01L 23/4006
174/16.3

(Continued)

FOREIGN PATENT DOCUMENTS

| CN | 1862793 A | 11/2006 |
|---|---|---|
| CN | 201230107 Y | 4/2009 |

(Continued)

*Primary Examiner* — Tuan T Dinh
(74) *Attorney, Agent, or Firm* — Ming Chieh Chang; Wei Te Chung (57) ABSTRACT

An independent loading mechanism for use with a CPU connector includes a metallic frame cooperating with a back plate module to sandwich a printed circuit board therebetween. A plurality of screw nut units are provided around the four corners of the frame. A plurality of hollow spacers are secured to the corresponding through holes of the frame so as to allow the corresponding screw nut units moveable relative to the frame along the vertical direction within a range larger than a thickness of the frame, thus avoiding improper interference between the screw nut units and the corresponding screw posts of the back plate module during sequential screwing.

9 Claims, 13 Drawing Sheets

(52) U.S. Cl.
CPC ..... *H05K 7/12* (2013.01); *H05K 2201/10189* (2013.01); *H05K 2201/10409* (2013.01); *H05K 2201/10424* (2013.01); *H05K 2201/10545* (2013.01)

(56) References Cited

U.S. PATENT DOCUMENTS

| | | | | |
|---|---|---|---|---|
| 5,926,357 | A | * | 7/1999 | Elias ............... H01G 9/10 361/302 |
| 5,964,625 | A | * | 10/1999 | Farley ............. H01R 4/4872 439/817 |
| 9,478,881 | B2 | | 10/2016 | Zhang et al. |
| 9,726,206 | B2 | * | 8/2017 | Spolyar ............ B60R 9/04 |
| 2007/0258207 | A1 | * | 11/2007 | Su ................. H01L 23/4006 361/679.46 |
| 2010/0130030 | A1 | * | 5/2010 | Liao ............... H05K 7/1053 439/68 |
| 2012/0289075 | A1 | | 11/2012 | Yeh |

FOREIGN PATENT DOCUMENTS

| | | |
|---|---|---|
| CN | 101888743 A | 11/2010 |
| CN | 202012812 U | 10/2011 |
| CN | 205902280 U | 1/2017 |
| CN | 107453103 A | 12/2017 |
| DE | 102014216004 A | 3/2015 |
| TW | M420880 U | 1/2012 |

\* cited by examiner

RIVET SPACER FOR COMPROMISING ASSEMBLING BETWEEN TWO PARTS SECURED TO EACH OTHER VIA SCREW STRUCTURE

BACKGROUND OF THE INVENTION

1. Field of the Invention

The present invention relates generally to an electrical connector assembly, and particularly to the independent loading mechanism used with an electrical connector for receiving a CPU (Central Processing Unit).

2. Description of Related Arts

Figure 1:
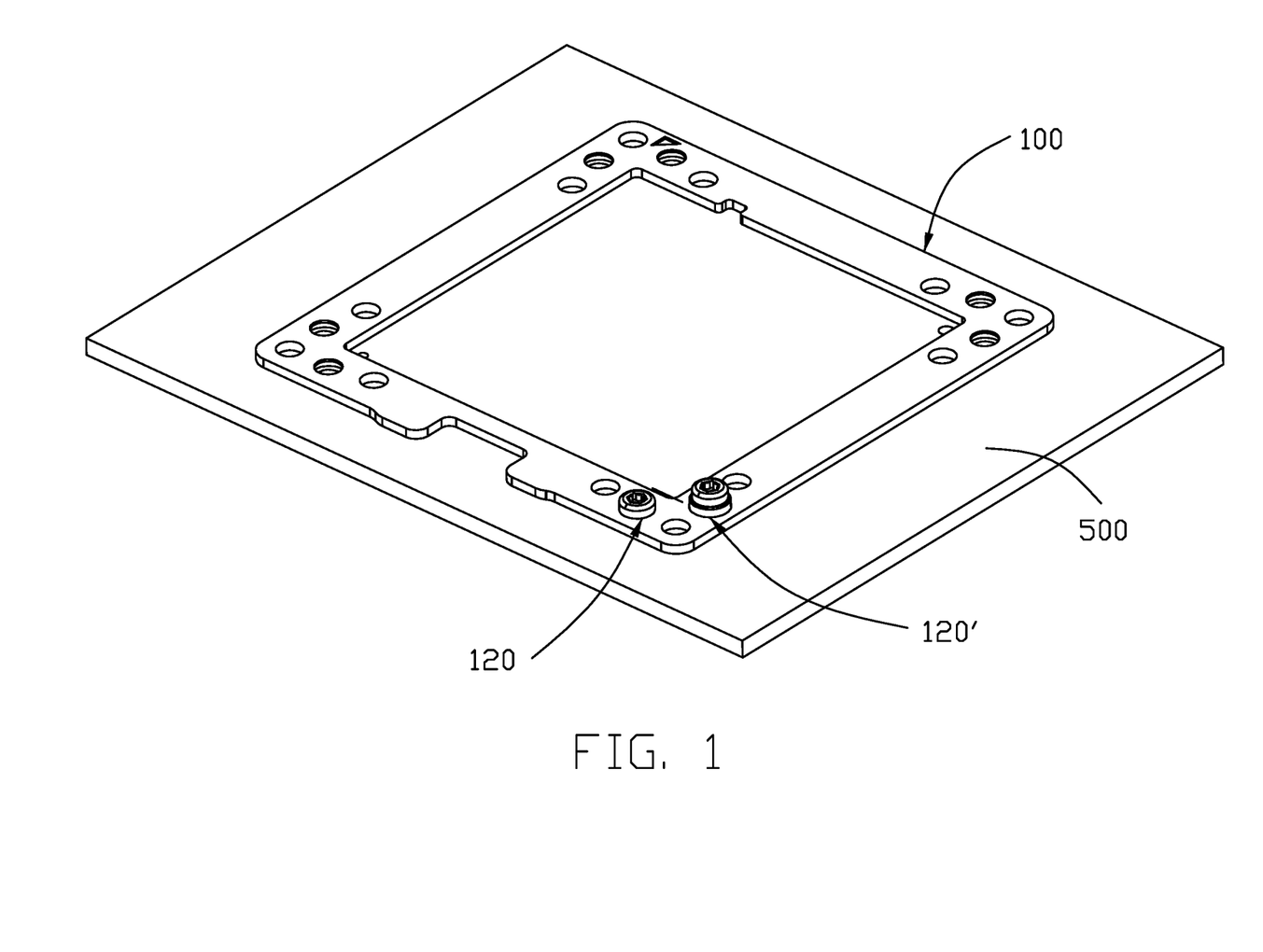
FIG. 1 is an independent loading mechanism mounted upon a printed circuit board according to a preferred embodiment of the invention.
Figure 1A:
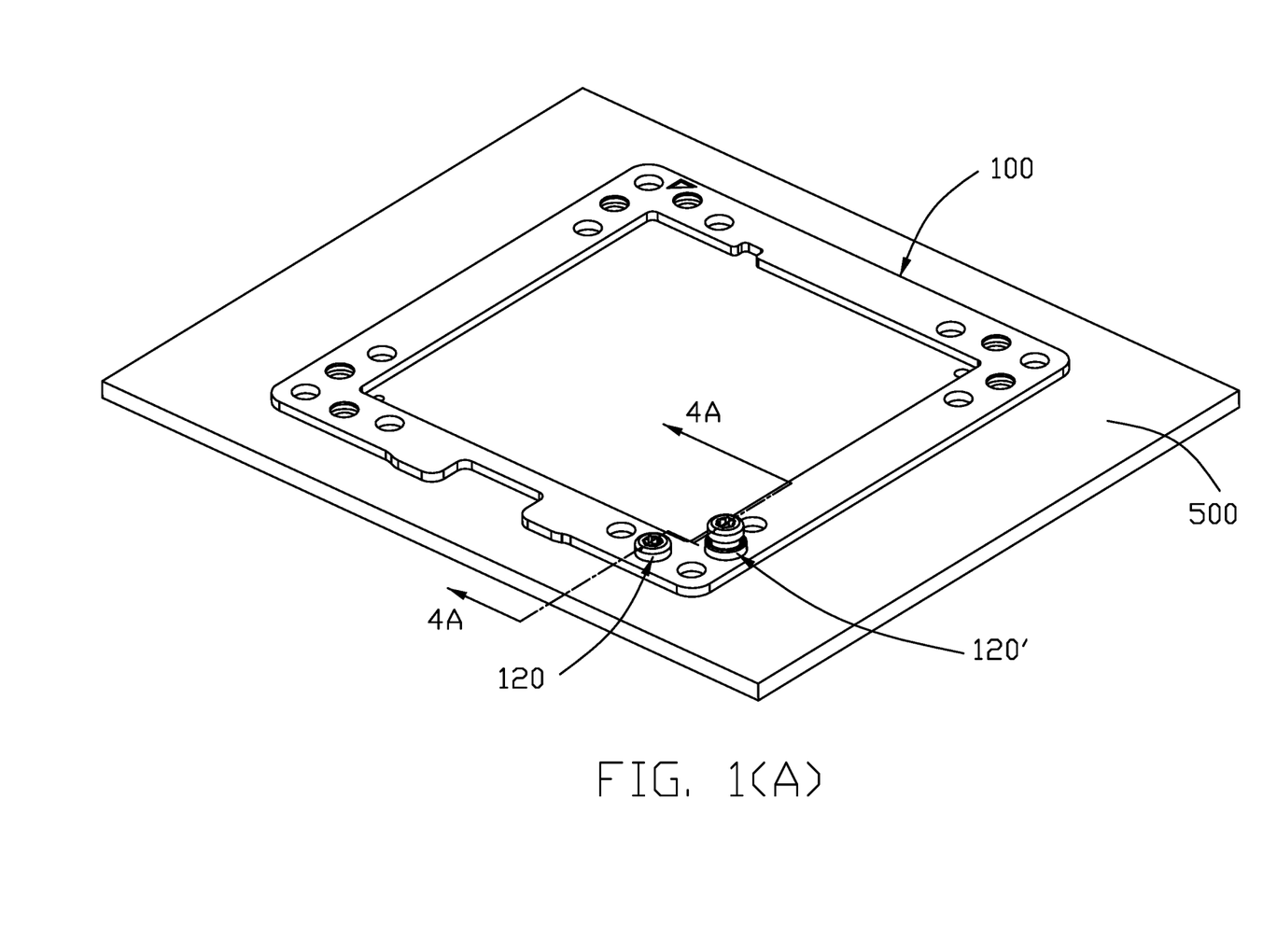
FIG. 1(A) is the independent loading mechanism mounted upon the printed circuit board of FIG. 1 wherein the screw nut unit is upwardly pushed by the screw post of the back plate module when the screw nut unit has not been screw with the screw post.
Figure 2:
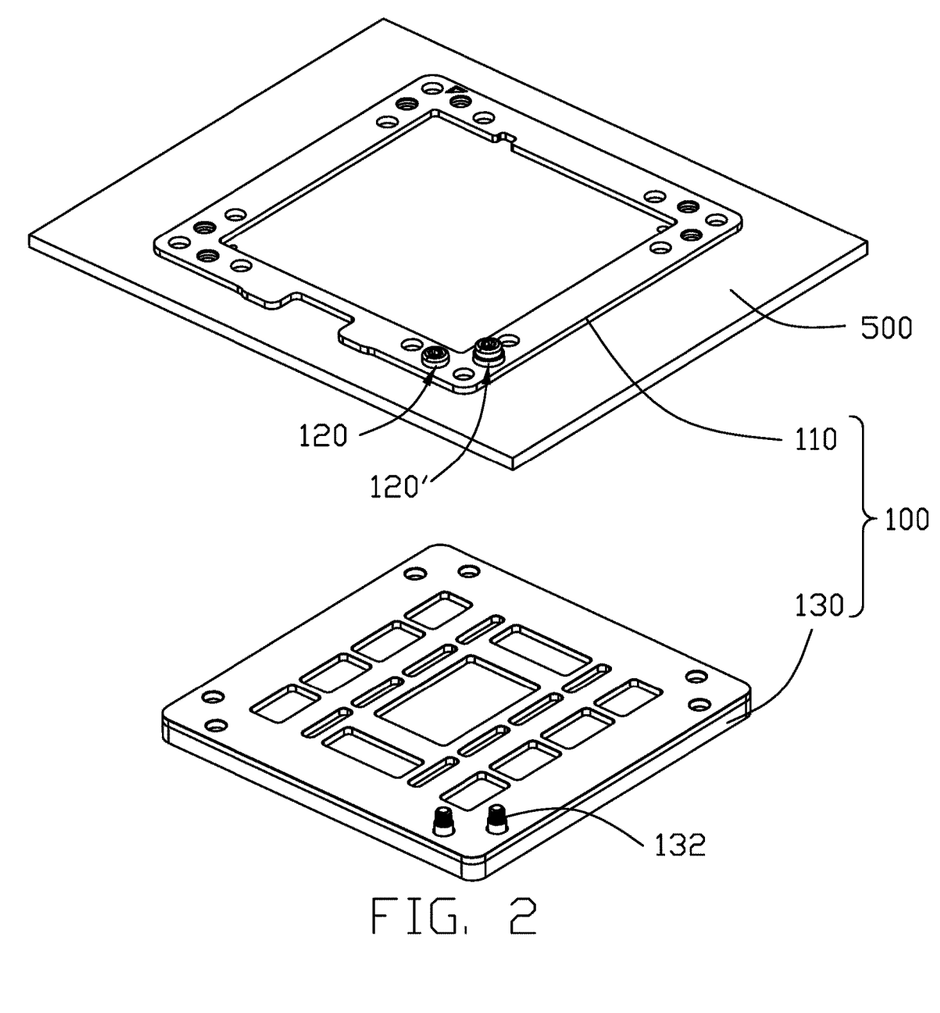
FIG. 2 is a perspective view of the independent loading mechanism mounted upon the printed circuit board of FIG. 1 with the corresponding back plate module disassembled therefrom.
Figure 3:
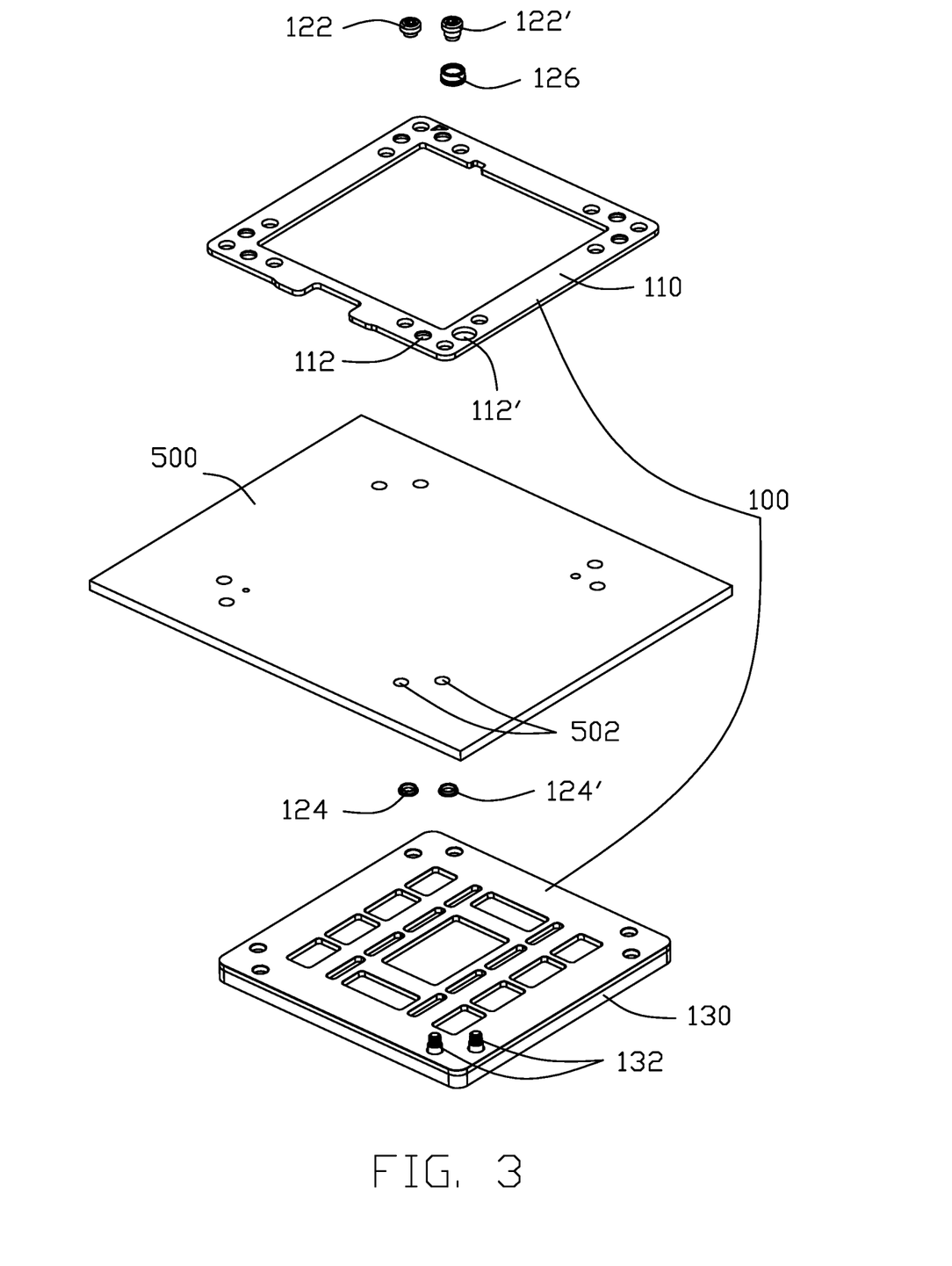
FIG. 3 is an exploded perspective view of the independent loading mechanism disassembled from the printed circuit board of FIG. 2.
Figure 4:
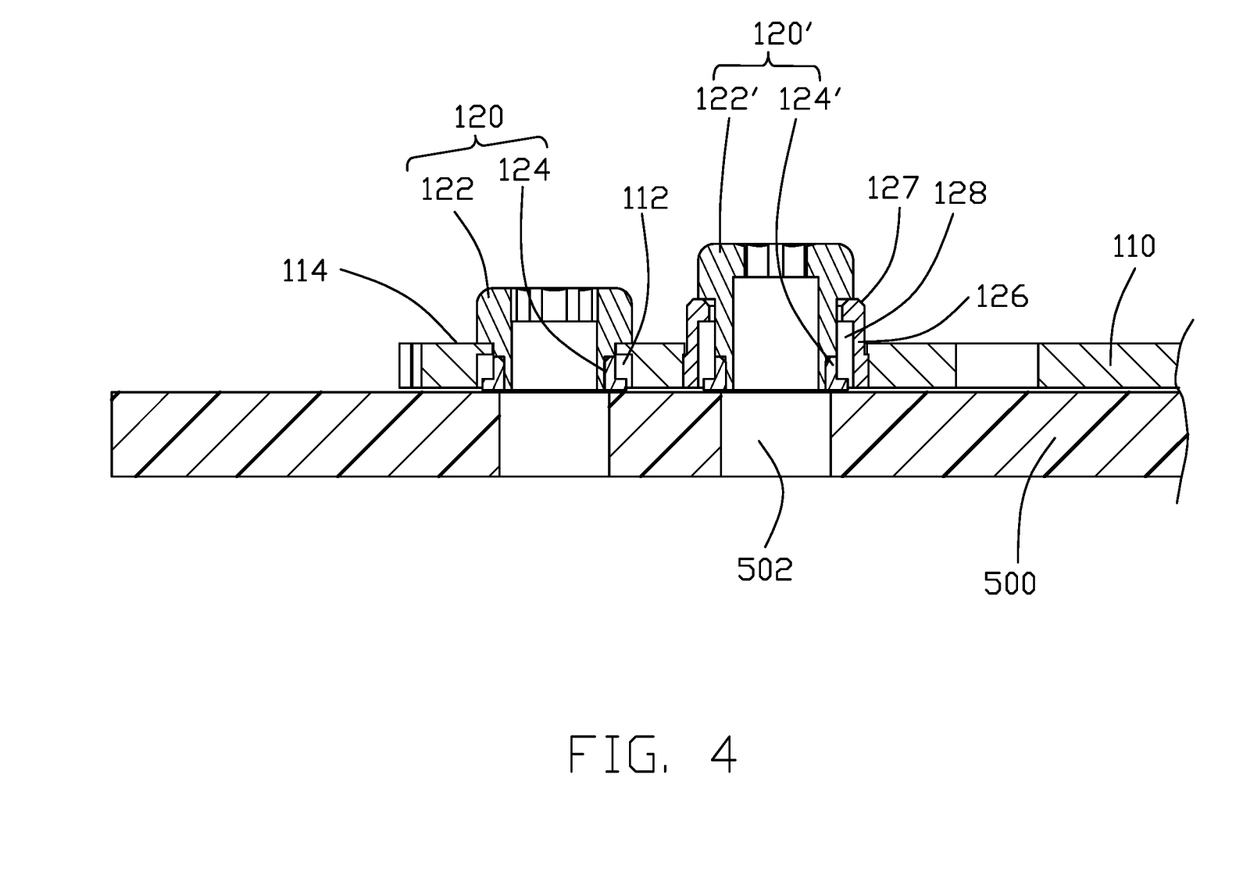
FIG. 4 is a cross-sectional view of the independent loading mechanism seated upon the printed circuit board of FIG. 1 or 2 wherein the screw nut unit is not upwardly pushed by the screw post of the back plate module.
Figure 4A:
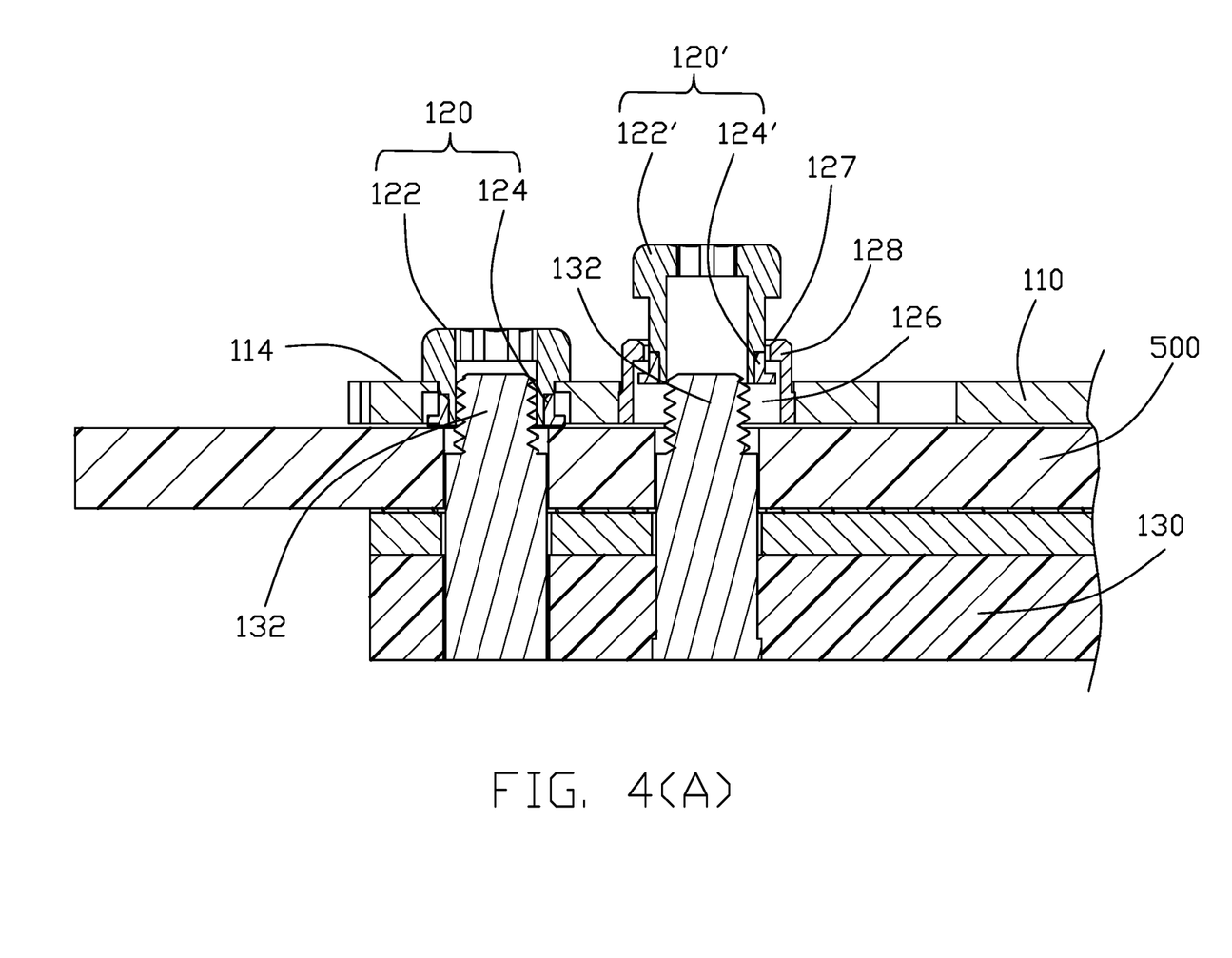
FIG. 4(A) is a cross-sectional view of the independent loading mechanism seated upon the printed circuit board of FIG. 1(A) wherein the screw nut unit is upwardly pushed by the screw post of the back plate module.
Figure 5:
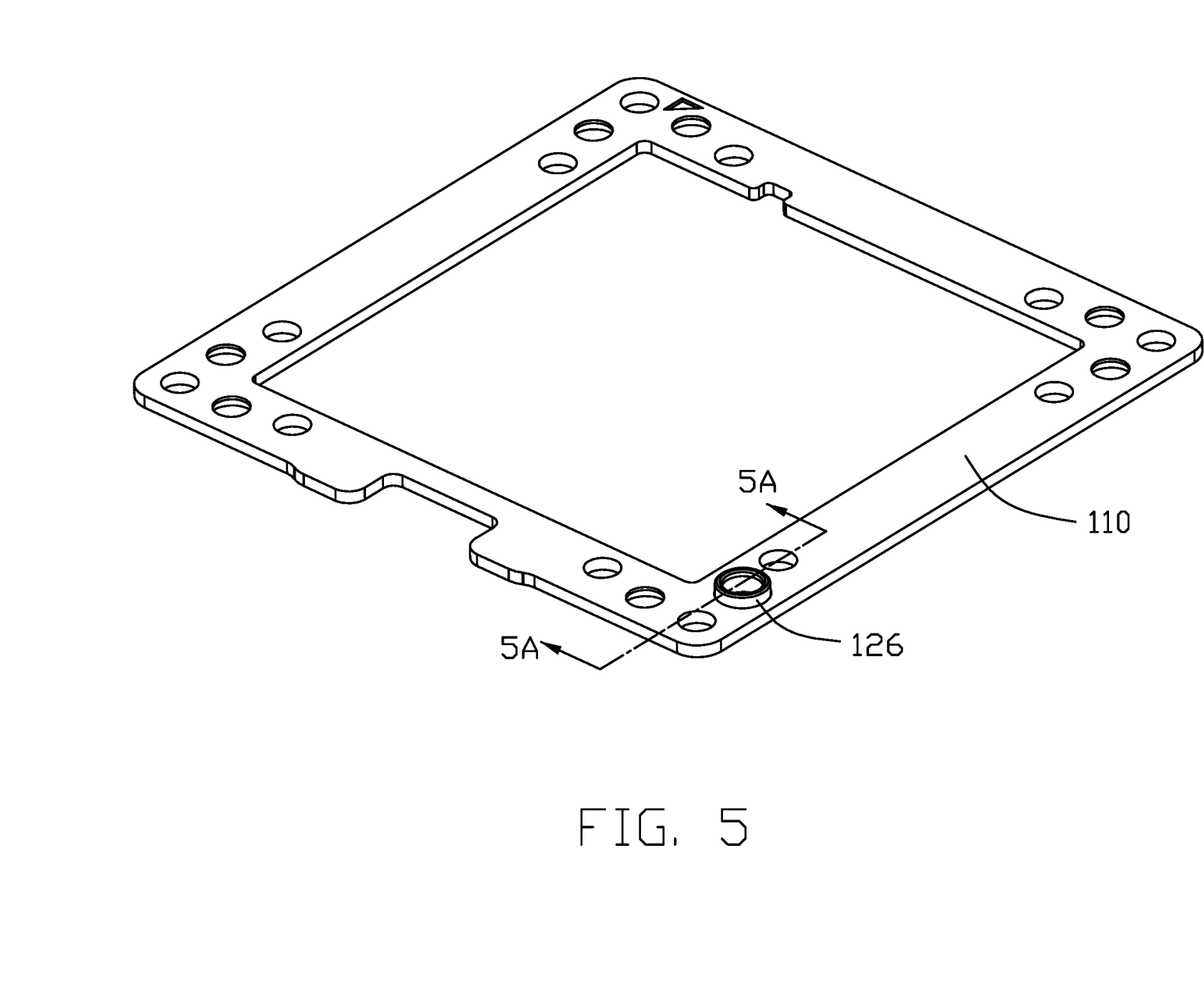
FIG. 5 is a perspective view of the frame with one associated screw nut unit.
Figure 5A:
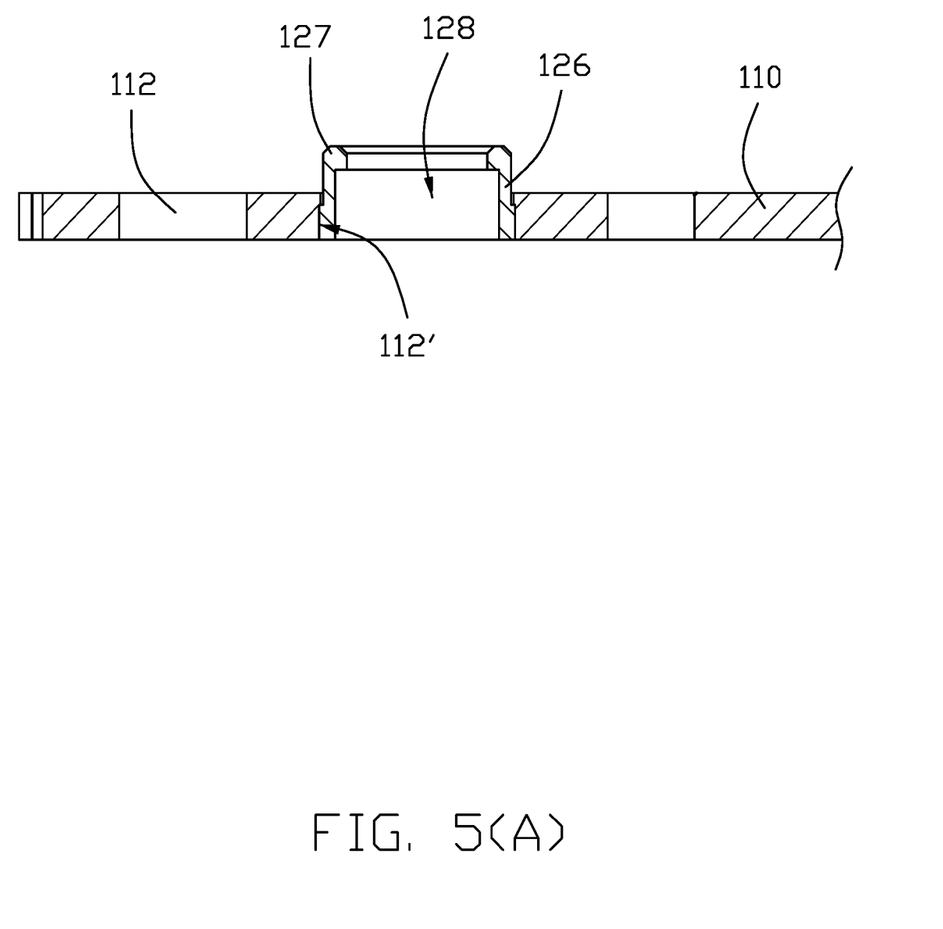
FIG. 5(A) is a cross-sectional view of the frame with the associated screw nut of FIG. 5.
Figure 6:
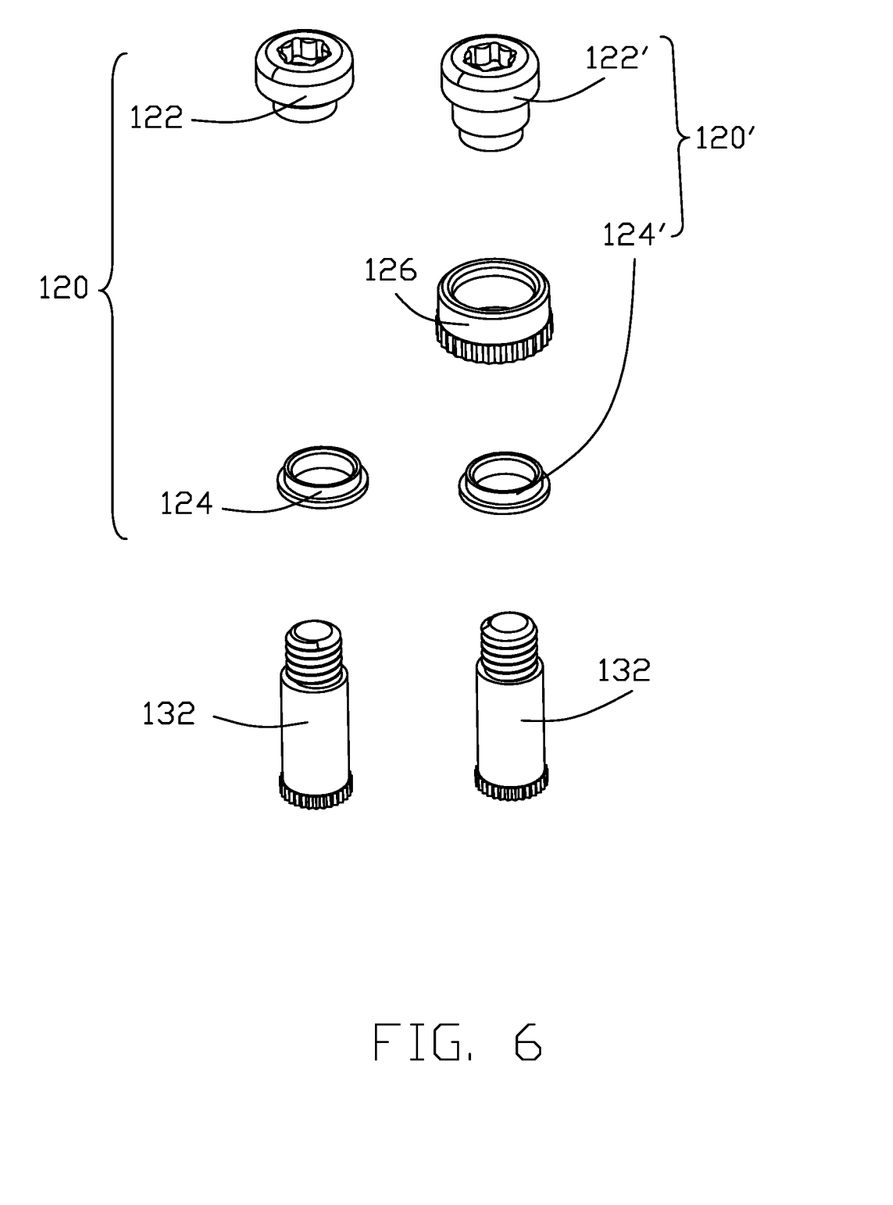
Figure 7:
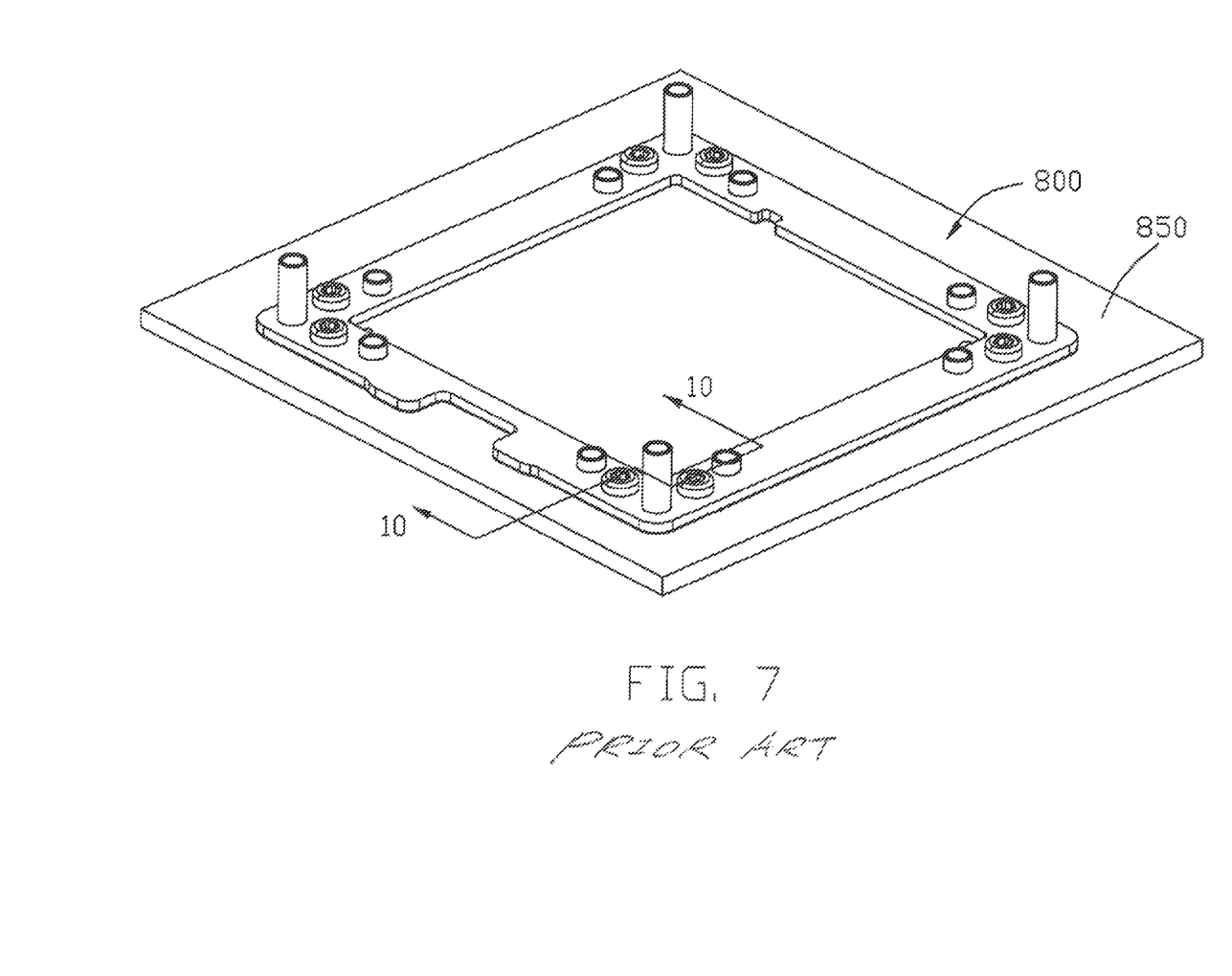
FIG. 7 is a perspective view of the independent loading mechanism mounted upon the printed circuit board of the conventional design.
Figure 8:
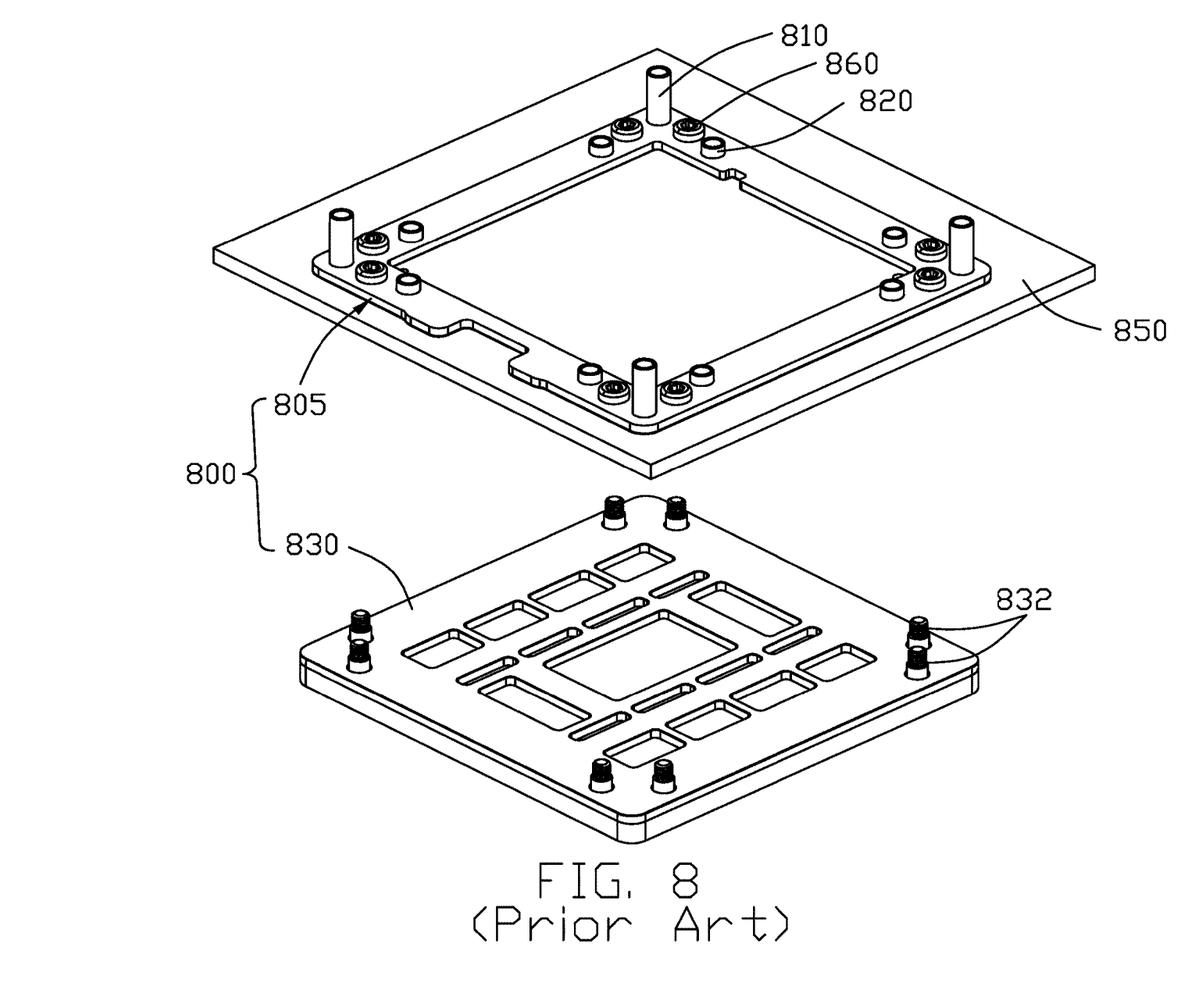
FIG. 8 is a perspective view of the independent loading mechanism mounted upon the printed circuit board of FIG. 7 with the back plate module removed therefrom.
Figure 9:
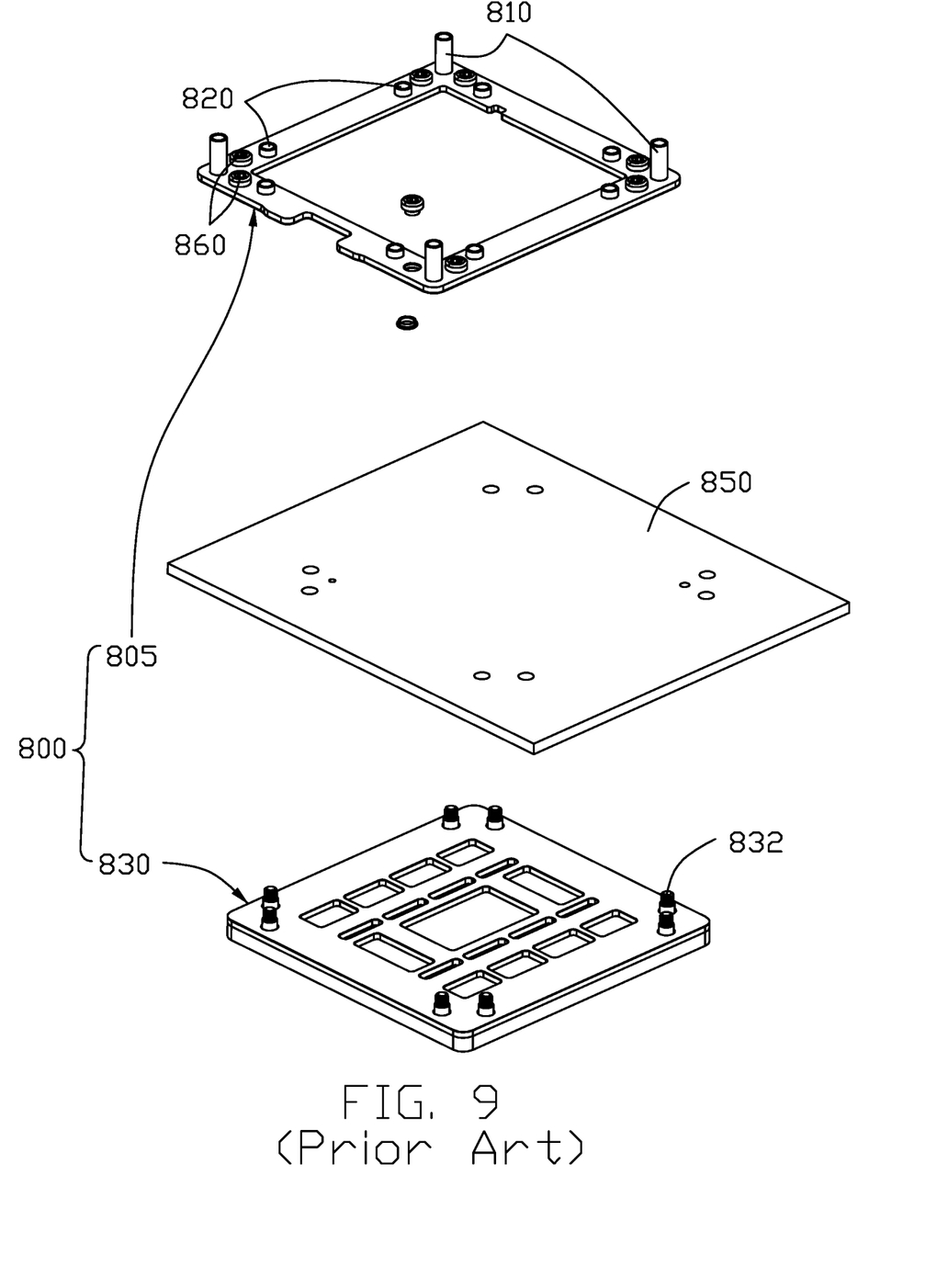
FIG. 9 is an exploded perspective view of the independent loading mechanism of FIG. 7 dissembled from the printed circuit board and the back plate module.
Figure 10:
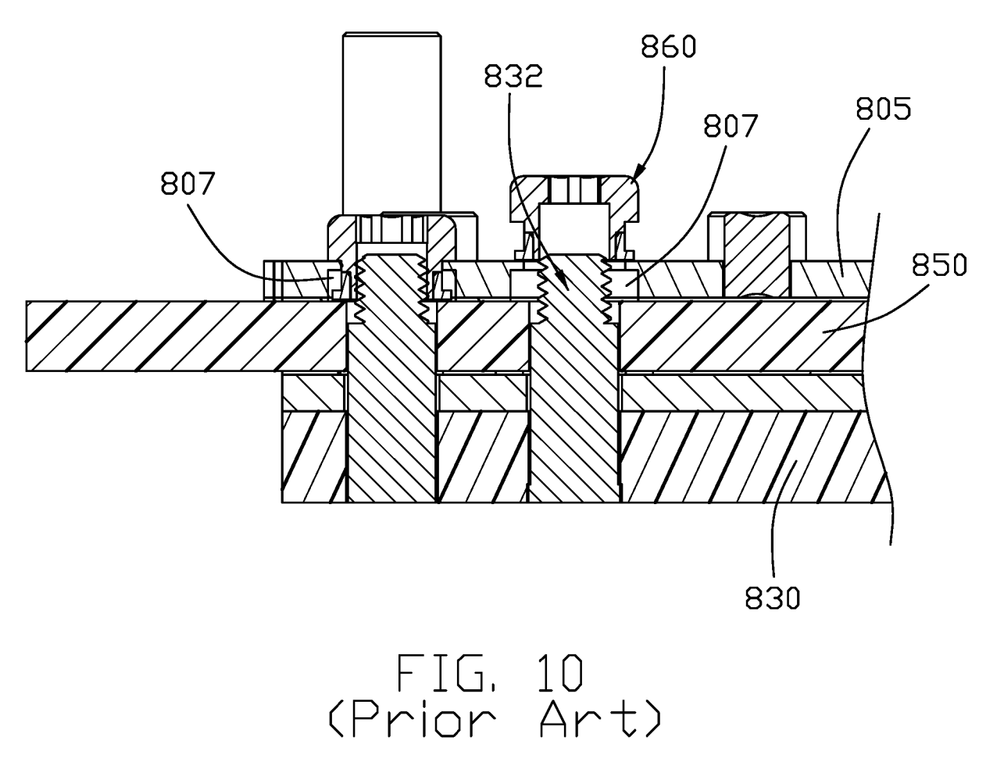
FIG. 10 is a cross-sectional view of the independent loading mechanism seated upon the printed circuit board wherein the screw nut unit is forcibly and defectively upwardly pushed out of the corresponding hole in the frame.

As shown in FIGS. 7-10, the independent loading mechanism 800 for use with an electrical connector, i.e., the CPU socket, includes a metallic frame 805 mounted upon a printed circuit board 850 to surround the electrical connector. Understandably, a plurality of fastening structures 810 for securing to the heat sink, and a plurality of fastening structures 820 for securing to the load plate are provided on the frame 805 so as to secure the heat sink and the load plate upon the frame 805. In addition, to reinforce the frame 805, a back plate module 830 is located under the printed circuit board 850 and secured to the frame 805 so as to sandwich the printed circuit board 850 therebetween. The securement between the back plate module 830 and the frame is done by a plurality of screw posts 832 integrally upwardly extending from the back plate module 830 and a plurality of corresponding screw nut units 860 associated with the frame 805. Understandably, before securing to the corresponding screw post 832, the screw nut unit 860 is allowed to be relatively moveable in the corresponding hole 807 in the frame 805 along the vertical direction with a limited distance not more than a thickness of the frame 805. Anyhow, during screwing the screw nut units 860 unto the corresponding screw posts 832 sequentially, the screw nut units 860, which are waiting for screwing to the corresponding screw posts 832, may be forcibly and defectively pushed out of the corresponding hole due to the corresponding screw post 832 as shown in FIG. 10. If not, the interference between the waiting screw nut units 860 and the corresponding screw posts 832 may hinder the whole assembling process. Therefore, it is required to provide the solution for compromise the interfere A independent loading mechanism having a metallic frame mounted upon a printed circuit board wherein the screw nut unit for securing the frame and the back plate module is moveable with a range larger than a thickness of the frame for lowing the potential interference derived from the screw post of the back plate module, is desired.

SUMMARY OF THE INVENTION

To achieve the above object, an independent loading mechanism for use with a CPU connector includes a metallic frame cooperating with a back plate module to sandwich a printed circuit board therebetween. A plurality of screw nut units are provided around the four corners of the frame. A plurality of hollow spacers are secured to the corresponding through holes of the frame so as to allow the corresponding screw nut units moveable relative to the frame along the vertical direction within a range larger than a thickness of the frame, thus avoiding improper interference between the screw nut units and the corresponding screw posts of the back plate module during sequential screwing.

BRIEF DESCRIPTION OF THE DRAWING

FIG. 6 shows the regular/conventional screw nut unit and the novel lengthened screw nut unit with the corresponding spacer and the corresponding screw posts; and.

DETAILED DESCRIPTION OF THE PREFERRED EMBODIMENT

Referring to FIGS. 1-6, an independent loading mechanism 100 is seated/mounted upon a printed circuit board 500. The independent loading mechanism 100 includes a metallic frame 110 and a back plate module 130 wherein the back plate module 130 is of the conventional type having a plurality of upwardly extending screw posts 132 thereof. As mentioned before, the CPU connector (not shown) is adapted to be mounted upon the printed circuit board 500 and surrounded in the frame 110. The frame 110 is equipped with some upwardly extending/exposed fastening structures (not shown) for securing to the load plate (not shown) and the heat sink (not shown) both of which may be referred to FIGS. 7-10. Four pairs of screw nut nuts 120, 120' (only one pair shown) are retained in the corresponding holes 112, 112' in the frame 110 and moveable along the vertical direction relative to the frame 110. One screw nut unit 120 is of the conventional type and consists of the conventional type nut 122 and the corresponding conventional collar 124 riveted with each other so as to retain the screw nut unit 120 in the corresponding hole 112 in a floatable manner with a range smaller than the thickness of the frame 110. The other screw unit 120' is of the lengthened type consisted of the lengthened type nut 122' and the correspond conventional collar 124' and further a tubular spacer 126. The corresponding hole 112' in the frame 110 is larger than the conventional hole 112 receiving the conventional screw nut unit 120. The tubular spacer 126 is secured within the hole 112'. The vertical dimension of the tubular spacer 126 is larger than a thickness of the frame 110 in the vertical direction so as to leave a space 128 larger than the thickness of the frame 110. Notably, the spacer 128 has a ceiling section at the top end to cooperate with the rim of the collar 124' for prevent upward withdrawal of the screw nut unit 120' therefrom. Therefore, for each pair of screw nut units 120, 120' when the conventional type screw nut unit 120 is fastened to the corresponding screw post 132, the lengthened type screw nut unit 120' is forcibly pushed upwardly by the corresponding screw post 132 and moved to the upper position without interference with the spacer 126. Notably, because the space 128 provided by the spacer 126 is large enough to allow the upward movement of the screw nut unit 120', there is no damage to the screw nut unit 120' or the frame 110. Notably, similar to the convention type screw nut unit 120 of which the conventions nut 122 is required to downwardly abut against the upper surface 114 of the frame 110 when fastened with the corresponding screw post 132, the lengthened nut 122' or the lengthened type screw nut unit 120' also downwardly abuts against the top face 127 of the spacer 126 when fastened with the corresponding screw post 132. Understandably, the printed circuit board 500 forms a plurality of holes 502 to receive the corresponding screw posts 132 therein so that the printed circuit board 500 is tightly sandwiched between the frame 110 and the back plate module 130 via securement between the screw posts 132 and the corresponding screw nut units 120, 120'. Notably, the rim of the collar 124 and 124' prevents the screw nut unit 120 and 120' from being upwardly withdrawal from the frame 110.

Understandably, for each pair of screw nut units, only one is required to be lengthened and equipped with an additional spacer. In other embodiments, the screw nut unit may be replaced with the screw stud as long as such a securing mechanism uses screwing operation. The spacer is either metal or plastic. In each pair of screw nut units, the distance therebetween is less than 30 mm. In other embodiments, for all four pairs of screw nut units, at least one pair has one lengthened nut and the corresponding spacer for distinguishing from the conventional independent loading mechanism. In this embodiment, the dimension of the space 128 of the spacer 126 in the vertical direction is larger than the distance with which the rim of the collar 124' is lifted by the screw post 132 from the top surface of the printed circuit board 500, Understandably, the rim of the (traditional) collar 124 is roughly seated upon the top surface of the printed circuit board 500 when the nut 122 downwardly abuts against the upper surface 114 of the frame 112. Similarly, the rim of the collar 124' is roughly seated upon the top surface of the printed circuit board 500 when the lengthened nut 124' downwardly abuts against the top face 127 of the spacer 126. Notably, if available, the rim of the collar 124, 124' may not touch the top surface of the printed circuit board 500 under such situations.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An independent loading mechanism for being mounted to a printed circuit board which defines opposite top and bottom surfaces and a plurality of through holes therein, comprising:
    a metallic frame for mounting upon the top surface of the printed circuit board and a back plate module for mounting upon the bottom surface of the printed circuit board so as to cooperatively sandwich the printed circuit board therebetween in a vertical direction;
    the back plate module forming plural pairs of upwardly extending screw posts thereof for extending through corresponding through holes in the printed circuit board;
    the frame forming plural pairs of holes adapted to be aligned with the corresponding through holes of the printed circuit board in the vertical direction;
    a tubular spacer secured to a corresponding hole of the frame; and
    plural pairs of screw nut units respectively retained in the corresponding pairs of holes for threadingly engaging corresponding screw posts, respectively, and at least in one pair, one screw nut unit thereof including a nut riveted with a corresponding collar and commonly moveable within the corresponding hole in the frame, and the other screw nut unit thereof including a lengthened nut riveted with another corresponding collar and commonly moveable within the tubular spacer; wherein
    the tubular spacer provides a space allowing said other screw nut unit to move relative to the frame in the vertical direction within a range larger than that of said one screw nut unit.

2. The independent loading mechanism as claimed in claim 1, wherein a dimension of the spacer is larger than a thickness of the frame in the vertical direction.

3. The independent loading mechanism as claimed in claim 1, wherein said another hole of the frame, which receives the spacer, is diametrically larger than said hole of the frame which receives said one screw nut unit.

4. The independent loading mechanism as claimed in claim 1, wherein when the other screw nut is upwardly lifted by the corresponding screw post, a rim of the corresponding collar is spaced from a top portion of the spacer with a distance in the vertical direction.

5. The independent loading mechanism as claimed in claim 1, wherein the collar forms a ceiling section at a top end for cooperating with a rim of the corresponding collar for prevent upward withdrawal of said other screw nut unit therefrom.

6. The independent loading mechanism as claimed in claim 1, wherein when the lengthened nut downwardly abuts against a top face of the spacer, the rim of the corresponding collar is adapted to be seated upon a top surface of the printed circuit board.

7. The independent loading mechanism as claimed in claim 1, wherein in said at least one pair, the distance between said one screw nut unit and said other screw nut unit is less than 30 mm.

8. The independent loading mechanism as claimed in claim 1, wherein the spacer is either metal or plastic.

9. The independent loading mechanism as claimed in claim 1, wherein the screw nut unit is equipped with a threaded stud on a top end thereof.

\* \* \* \* \*